Feb. 23, 1965 L. M. VALLESE 3,171,085

UNILATERALIZED TRANSISTOR AMPLIFIER

Filed May 19, 1959 3 Sheets-Sheet 1

INVENTOR.
LUCIO M. VALLESE
BY
Louis B. Applebaum
ATTORNEY

UNILATERALIZED TRANSISTOR AMPLIFIER

Filed May 19, 1959 3 Sheets-Sheet 2

INVENTOR.
LUCIO M. VALLESE
BY
Louis B. Applebaum
ATTORNEY

Feb. 23, 1965 L. M. VALLESE 3,171,085

UNILATERALIZED TRANSISTOR AMPLIFIER

Filed May 19, 1959 3 Sheets-Sheet 3

INVENTOR.
LUCIO M. VALLESE
BY
Louis B. Applebaum
ATTORNEY

United States Patent Office 3,171,085

Patented Feb. 23, 1965

3,171,085
UNILATERALIZED TRANSISTOR AMPLIFIER

Lucio M. Vallese, New York, N.Y., assignor, by mesne assignments, to the United States of America as represented by the Secretary of the Navy Filed May 19, 1959, Ser. No. 814,360
10 Claims. (Cl. 330—17)

This application is a continuation-in-part of my original co-pending application, Serial No. 754,953, filed August 14, 1958, for "Transistor Amplifier," now abandoned.

This invention relates to transistor amplifiers and especially to unilateralized transistor amplifiers.

Unilateralization of transistor amplifiers (design of transistor amplifiers for unidirectional amplification of energy) has until now been accomplished by the use of transformers or the use of bridge compensating networks at the input or output terminals. However, there are inherent disadvantages in the use of transformers and bridge compensating networks—when transformers are used, the frequency range of an amplifier is limited by the response of the transformer, and when bridge compensating networks are used, the amplifier's input and output terminals have no common ground connection.

The objects and advantages of the present invention are accomplished by feeding back to the input of a transistor amplifier a signal equal in magnitude and opposite in phase to the signal fed back through the transistor itself by intrinsic feedback. A typical embodiment of the invention comprises a pair of complementary, three-electrode transistors, the collector of the first being tied to the base of the second and the collector of the second being tied to the base of the first, the second transistor being employed to feed back a signal from the collector to the base of the first transistor. (This is hereinafter referred to as a hook common collector circuit configuration or arrangement.) The base electrode of the first transistor is employed as the input and an impedance in the emitter circuit of the feedback transistor permits adjustment of the phase and magnitude of the feedback signal.

Noteworthy features of the device are an input impedance which may be varied from a low value to a value in the order of megohms, a small output impedance, and power and current gains which are inversely proportional to the load impedance.

Another feature of the invention is that, by employing different input and output terminals, the device becomes a non-unilateral amplifier with very small input impedance and theoretically infinite voltage and power gains. The voltage and power gains which are obtained in practical applications are very high.

An object of the invention is to provide a transformerless, unilateral transistor amplifier having a common ground for input and output.

Another object is to provide a unilateral transistor amplifier having a very large input impedance which is independent of the load impedance.

A further object is to provide a unilateral transistor amplifier having an input impedance the value of which is smoothly controllable in a wide range from a very low to a very high value, thereby permitting input impedance matching.

Other objects and many of the attendant advantages of this invention will be readily appreciated as the same becomes better understood by reference to the following detailed description when considered in connection with the accompanying drawings wherein.

Similar reference characters apply to similar elements in the different views.

Figure 1:
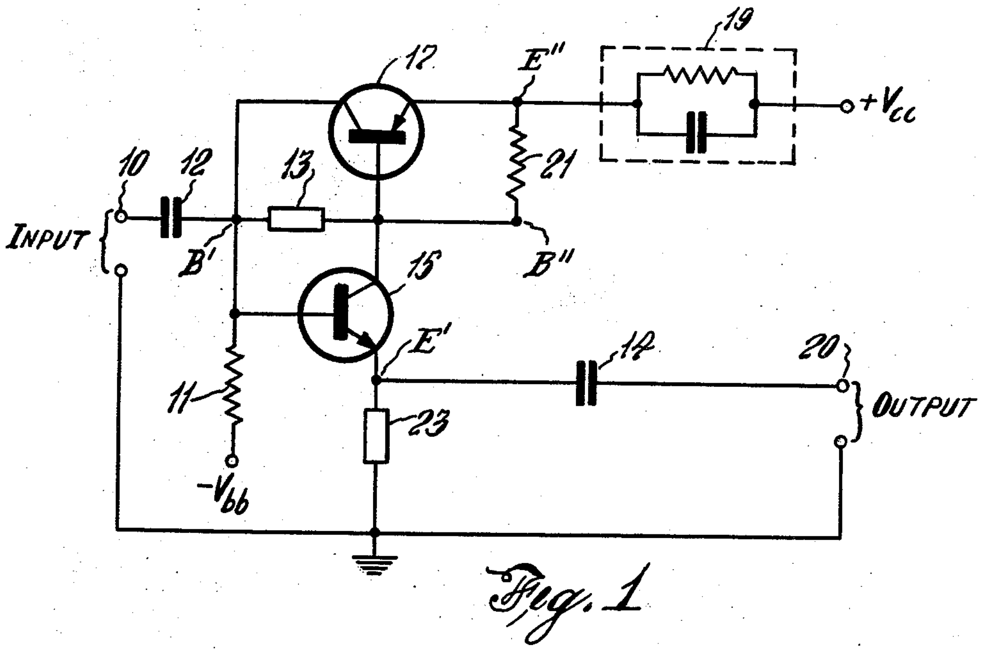
FIG. 1 is a schematic circuit diagram of an embodiment of the invention.

In FIG. 1, a pair of three-electrode transistors 15 and 17 are connected in a so-called common-collector, "hook" circuit arrangement. The base electrode of transistor 17 is connected to the collector electrode of transistor 15, and the collector electrode of transistor 17 is connected to the base electrode of transistor 15.

The transistors are biased by connecting the emitter of transistor 17 to a suitable source of positive potential ($+V_{cc}$) through an impedance or impedance network 19, the collector of transistor 15 to the emitter of transistor 17 through a resistance 21, and the collector of transistor 17 and the base of transistor 15 to a source of negative supply voltage ($-V_{bb}$) through a resistance 11. The transistors 15 and 17 are shown as NPN and PNP transistors, respectively, although they can be replaced with PNP and NPN transistors, respectively, if the bias voltage polarities are reversed.

The load, impedance 23, is connected between the emitter of transistor 15 and ground. An output terminal 20 is connected to the junction between the load impedance 23 and the emitter electrode through a blocking capacitor 14, the output signal being developed between the output terminal 20 and ground.

The input signal is fed into the device between input terminal 10 and ground, the input terminal 10 being connected to the base of transistor 15 through capacitor 12.

The operation of the circuit is as follows: transistor 15 constitutes an amplifier in which there is internal, or intrinsic, feedback from collector to base. This intrinsic feedback gives the amplifier a bilateral amplification characteristic. Transistor 17 is used to provide feedback from the collector to the base of transistor 15, the feedback signal provided by transistor 17 being adjusted to be equal in magnitude and opposite in polarity to the intrinsic feedback through transistor 15. Thus, the intrinsic feedback signal is cancelled at the input to transistor 15 and transistor 15 is unilateralized.

Adjustment of the magnitude and phase of the feedback signal through transistor 17 is accomplished by proper selection or adjustment of the value of impedance 19 which may, for example, be a combination of a resistance and capacitance in parallel.

The proper value of impedance 19 ($Z_{19}$) is the value at which unilateralization is obtained. The value of $Z_{19}$ is mathematically expressed by the equation:

$$Z_{19}=\frac{(Z_m-Z_d)Z_{13}-Z_dZ_b}{Z_b+Z_c+2Z_{13}}-Z_e$$

In this equation, $Z_m$, $Z_b$, $Z_c$ and $Z_e$ are the standard impedance parameters of transistors. (For example, see page 35 of Shea, "Principles of Transistor Circuits," published in 1953 by J. Wiley and Sons, and the article "Four Terminal PNPN Transistors," in the November 1952 issue of the Proceedings of the Institute of Radio Engineers, vol. 40, pp. 1361–1364.) $Z_d$ is a somewhat less commonly used parameter and is equal to $Z_c - Z_m$. It is assumed here that the parameters of transistors 15 and 17 are equal; a somewhat more cumbersome expression is obtained if this is not true.

Impedance 13 controls the value of the amplifier's input impedance. When $Z_{13}$ is infinite, the input impedance is approximately equal to $Z_m/2$; as $Z_{13}$ becomes smaller, the input impedance becomes smaller.

Figure 2:
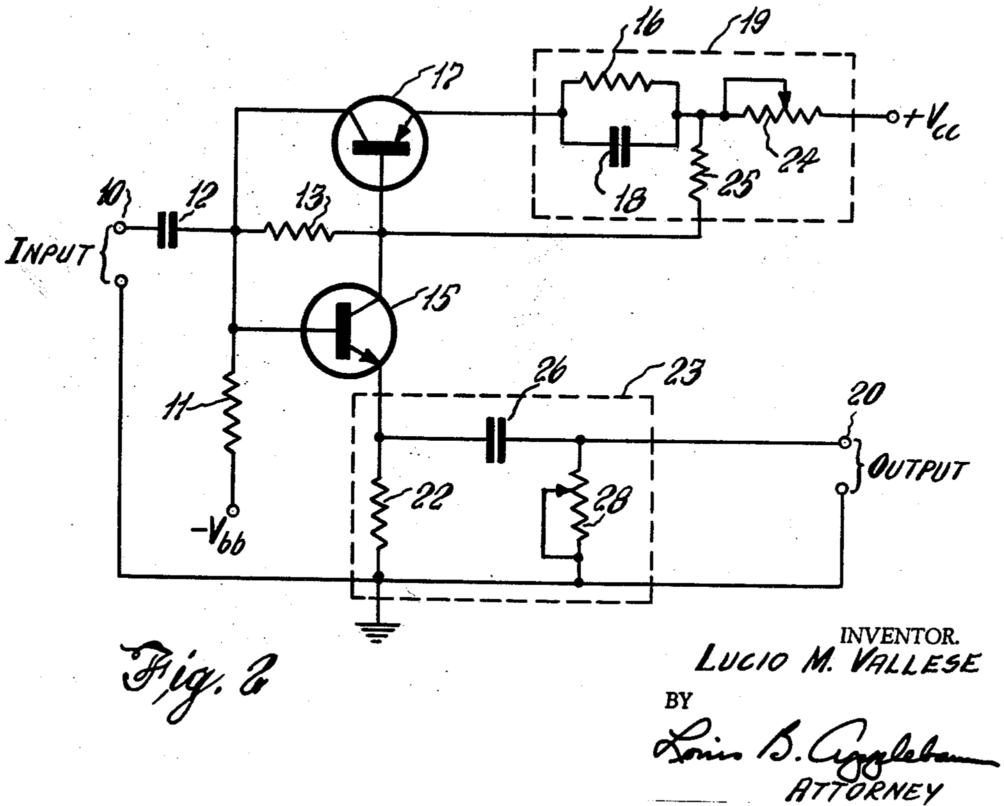
FIG. 2 is a schematic circuit diagram of a second embodiment of the invention.

FIG. 2 illustrates a modification of the embodiment of FIG. 1. The unilateralizing impedance 19 is somewhat different, the advantage of the impedance network of FIG. 2 being that the input impedance and the critical value of the unilateralizing impedance (the value at which the magnitude and polarity of the feedback signal are correct for cancelling the intrinsic feedback of transistor 15) decrease as the value of resistance 25 is decreased.

Impedance network 23 can be a $\pi$ network consisting of a resistance 22, a capacitance 26, and a variable resistance 28, the output terminal 20 being connected to the junction between the capacitance 26 and variable resistance 28.

Where the amplifier is to operate in an extended range of temperatures, one or all of the component elements of the unilateralizing impedance 19 may be made temperature dependent to maintain the unilateralized condition. For example, resistance 25 may be a thermistor with a negative temperature coefficient.

Figure 3:
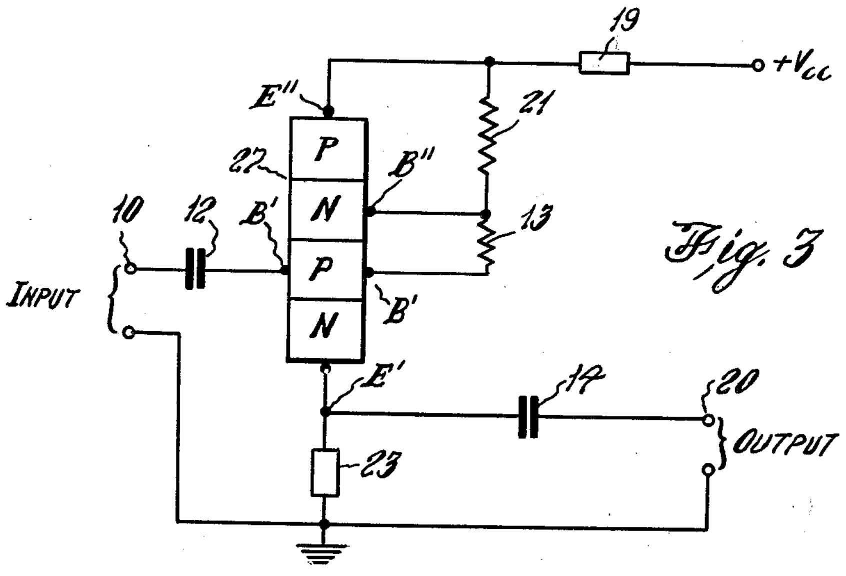
FIG. 3 is a schematic circuit diagram of a third embodiment of the invention utilizing a single multi-layer transistor.

FIG. 3 illustrates the substitution of a single PNPN transistor (NPNP can also be employed if the proper bias is used) for the two transistors of FIGS. 1 and 2. The PNPN transistor 27 is the equivalent of two complementary three-electrode transistors connected in a hook configuration as in FIGS. 1 and 2.

Figure 4:
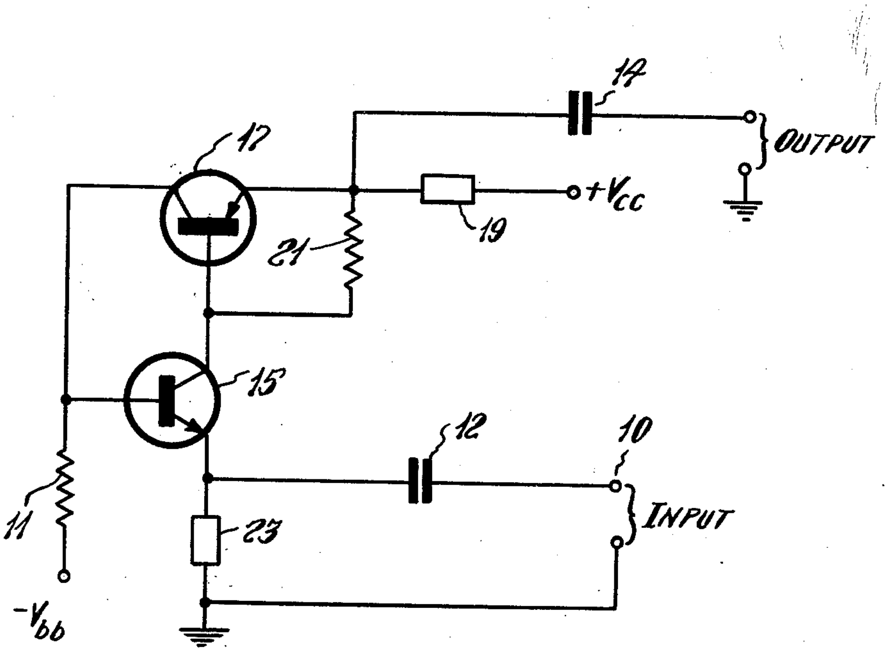
FIG. 4 is a schematic diagram illustrating how an amplifier of different characteristics can be obtained from the embodiment of FIG. 1 by utilizing different locations for the input and output terminals.

The circuits shown in FIGS. 1, 2 and 3 may be used with the input brought in at point E′ rather than B′ and the output taken from point E″ rather than E′. In this condition, the amplifier presents a very small input impedance, has unity current gain, very small input power and very large power gain. This circuit configuration is illustrated in FIG. 4.

Figure 5:
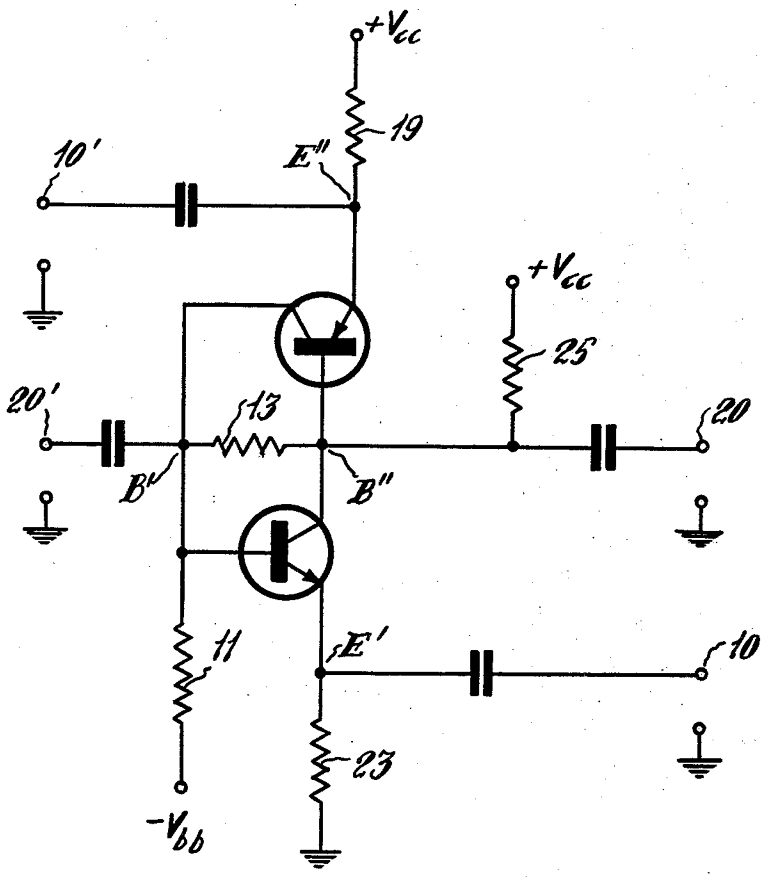
FIG. 5 is a schematic circuit diagram of a symmetrical amplifier based on the embodiment shown in FIG. 1.

The amplifier of this invention may be made symmetrical with respect to the two emitters (points E′ and E″) and the two bases (points B′ and B″). In FIG. 5, for simplification purposes, all impedances except the input and output blocking capacitors have been shown as resistances. After the proper values for resistances 25 and 13 have been chosen the values of resistances 19 and 23 are adjusted so that unilateral amplification is obtained from points B′ to E′ and from B″ to E″. This may be done experimentally by applying an audio signal between point E′ and ground and adjusting the unilateralizing resistance 19 so that the voltage between B′ and ground is zero; then unilateralization between B″ and E″ is obtained by applying an audio voltage to point E″ and adjusting resistance 23 (which, in this embodiment, becomes a unilateralizing resistance) so that the voltage between point B″ and ground is zero. Resistances 19 and 23 will be equal if the transistor parameters are the same. One possible application of the symmetrical amplifier is the simultaneous and separate amplification of two signals from E′ to B″ and from E″ to B′. Both inputs have a very small input impedance value and both amplifiers exhibit a very high power gain characteristic. The advantage of this circuit arrangement is a higher gain for each amplifier than if the amplifiers were working independently of one another while maintaining complete separation of signal channels.

Typical component values for the embodiment of FIG. 2 are given below:

| | |
|---|---|
| Transistor **15** | Western Electric 2N27. |
| Transistor **17** | Western Electric 2N43. |
| Resistor **11** | 2000,000 ohms. |
| Resistor **13** | 50,000 ohms. |
| Resistor **16** | 3,000 ohms. |
| Resistor **22** | 2,000 ohms. |
| Resistor **25** | 70 ohm thermistor, temperature coefficient of −2% per degree centigrade. |
| Capacitor **12** | 4 mfd. |
| Capacitor **18** | 2,400 mmfd. |
| Capacitor **26** | 4 mfd. |
| Variable resistor **24** | 500 ohms. |
| Variable resistor **28** | 1000 ohms. |

Obviously many modifications and variations of the present invention are possible in the light of the above teachings. It is therefore to be understood that within the scope of the appended claims the invention may be practiced otherwise than as specifically described.

I claim.

1. In a transistor amplifier circuit, in combination: transistor means corresponding to a pair of complementary-type transistors, each having a base, emitter and collector electrode, connected in a hook common collector circuit configuration wherein a signal is fed back to the base of one transistor from the collector of the other transistor; impedance means connected in the emitter circuit of said other transistor for controlling the magnitude and phase of the feedback signal, of such value that the feedback signal is equal in magnitude and opposite in phase to the intrinsic feedback signal through said one transistor, whereby the intrinsic feedback signal is cancelled, said transistor means thereby being unilateralized between the base and emitter of said one transistor; and connection means for a reference potential, the emitter circuit of said one transistor being returned to said reference potential connection.

2. In a transistor amplifier circuit, in combination: transistor means corresponding to a pair of transistors, each having a base, emitter and collector, connected in a hook common collector circuit configuration wherein a signal is fed back to the base of one transistor from the collector of the other transistor; connection means for a reference potential; load impedance means connected between said reference potential connection means and the emitter of said one transistor; and impedance means, connected in the emitter circuit of said other transistor for controlling the magnitude and phase of the feedback signal, of such value that the feedback signal is equal in magnitude and opposite in phase to the intrinsic feedback through said one transistor, whereby the intrinsic feedback is cancelled and said transistor means is unilateralized between the base and the emitter of said one transistor.

3. In a transistor amplifier, in combination: transistor means corresponding to a pair of complementary-type transistors, each having a base, emitter and collector electrode, connected in a hook common collector circuit configuration, input signals being applicable to the base of one of said transistors and output signals being derivable from its emitter circuit, the other transistor feeding back a signal from its collector to the base of said one transistor; impedance means, connected in the emitter circuit of said other transistor for controlling the magnitude and phase of the signal fed back to said one transistor, of such value that the feedback signal is opposite in phase and equal in magnitude to the intrinsic feedback through said one transistor, whereby the intrinsic feedback signal is cancelled; connection means for a reference potential; and load impedance means connected between said reference potential connection means and the emitter of said one transistor.

4. In a transistor amplifier, in combination: transistor means corresponding to a pair of complementary-type transistors each having a base, emitter and collector electrode, with the base of one transistor being connected to the collector of the other and the base of said other being connected to the collector of said one, a signal thus being fed back by said other transistor from its collector to the base of said one transistor; unilateralizing impedance means, connected in the emitter circuit of said other transistor for controlling the magnitude and phase of the signal fed back to said one transistor, of such value that the feedback signal is opposite in phase and equal in magnitude to the intrinsic feedback through said one transistor, whereby said intrinsic feedback signal is cancelled; connection means for a reference potential; load impedance means connected between the reference potential connection means and the emitter of said one transistor; and connections to said transistor means for applying suitable biasing potentials thereto.

5. A unilateral transistor amplifier comprising, in combination: a pair of complementary-type transistors, each having a base, emitter and collector electrode, with the base of one transistor being connected to the collector of the other and the base of said other being connected to the collector of said one, a signal thus being fed back by said other transistor from its collector to the base of said one transistor; unilateralizing impedance means, connected in the emitter circuit of said other transistor for controlling the magnitude and phase of the signal fed back to said one transistor, of such value that the feedback signal is opposite in phase and equal in magnitude to the intrinsic feedback through said one transistor, whereby said intrinsic feedback signal is cancelled; connection means for a reference potential; load impedance means connected between the reference potential connection means and the emitter of said one transistor; and connections to said transistor means for applying suitable biasing potentials thereto.

6. A symmetrical, unilateral transistor amplifier comprising, in combination: a pair of transistors of complementary type, each having a base, emitter and collector electrode, with the base of one transistor connected to the collector of the other and the base of said other being connected to the collector of said one, a signal thus being fed back by said other transistor from the collector to the base of said one transistor; a unilateralizing impedance, connected in the emitter circuit of said other transistor for controlling the magnitude and phase of the signal fed back to said one transistor, of such value that the feedback signal is equal in magnitude and opposite in polarity to the intrinsic feedback through said one transistor, whereby said intrinsic feedback signal through said one transistor is cancelled; a second unilateralizing impedance, connected in the emitter circuit of said one transistor, of such value the intrinsic feedback signal through said other transistor is similarly cancelled; a connection for a reference potential, said second unilateralizing impedance being connected between said reference potential connection and the emitter of said one transistor; and connections to said transistors for applying suitable biasing potentials thereto, a first output signal being obtainable at the collector of said one transistor from an input signal applied to the emitter of said one transistor, and a second output signal being simultaneously obtainable at the collector of said other transistor from a different input signal applied to the emitter of said other transistor.

7. In a transistor amplifier, in combination: a PNPN-type transistor, each conductivity region having an electrode in electrical contact therewith; a connection to a point of reference potential; a load impedance connected between said reference potential connection and the electrode of the outer N region; a unilateralizing impedance, connected to the electrode of the outer P region for controlling the magnitude and phase of feedback from the outer P region to the inner N region, of such value that this feedback signal is equal in magnitude and opposite in phase to the intrinsic feedback signal from the inner N region to the inner P region when an input signal is applied to the electrode of the inner P region, whereby said feedback signals cancel each other; and connections to said transistor for applying suitable biasing potentials thereto.

8. In a unilateral transistor amplifier, in combination: transistor means corresponding to a pair of complementary-type transistors, each having a base, emitter and collector electrode, connected in a hook common collector circuit configuration, input signals being applicable to the base of one of said transistors and output signals being derivable from its emitter circuit, the other transistor feeding back a signal from its collector to the base of said one transistor; and impedance means, connected in series with the emitter-collector circuit of said other transistor for controlling the magnitude and phase of the signal fed back to said one transistor, of such value that the feedback signal is opposite in phase and equal in magnitude to the intrinsic feedback through said one transistor, whereby the intrinsic feedback signal is cancelled.

9. In a unilateral transistor amplifier, in combination: transistor means corresponding to a pair of complementary-type transistors each having a base, emitter and collector electrode, with the base of one transistor being connected to the collector of the other and the base of said other being connected to the collector of said one, a signal thus being fed back by said other transistor from its collector to the base of said one transistor; unilateralizing impedance means, connected in series with the emitter-collector circuit of said other transistor for controlling the magnitude and phase of the signal fed back to said one transistor, of such valve that the feedback signal is opposite in phase and equal in magnitude to the intrinsic feedback through said one transistor, whereby said intrinsic feedback signal is cancelled; connection means for a reference potential; load impedance means connected between the reference potential connection means and the emitter of said one transistor; and connections to said transistor means for applying suitable biasing potentials thereto.

10. A device as set forth in claim 9, including an impedance connected from base to collector of said one transistor.

References Cited by the Examiner

UNITED STATES PATENTS 2,838,617 6/58 Tummers.
2,866,858 12/58 Sziklai.

FOREIGN PATENTS 1,174,118 3/59 France.

OTHER REFERENCES

A. Rider Publication: "Fundamentals of Transistors," by Leonard Krugman, second edition, revised pages 147–150, copyright 1954 and 1958, John F. Rider Publisher, Inc.

ROY LAKE, *Primary Examiner.*

BENNETT G. MILLER, ELI J. SAX, ROBERT H. ROSE, *Examiners.*